(12) United States Patent
Gill et al.

(10) Patent No.: US 8,018,691 B2
(45) Date of Patent: Sep. 13, 2011

(54) CPP DUAL FREE LAYER MAGNETORESISTIVE HEAD FOR MAGNETIC DATA STORAGE

(75) Inventors: Hardayal Singh Gill, Palo Alto, CA (US); Chang-Man Park, Mountain View, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 522 days.

(21) Appl. No.: 12/254,662

(22) Filed: Oct. 20, 2008

(65) Prior Publication Data

US 2010/0097729 A1    Apr. 22, 2010

(51) Int. Cl.
*G11B 5/39*    (2006.01)
(52) U.S. Cl. ............................... 360/324.12; 360/324.11
(58) Field of Classification Search ............. 360/324.12, 360/324.11, 324
See application file for complete search history.

(56) References Cited

U.S. PATENT DOCUMENTS

| | | | | |
|---|---|---|---|---|
| 5,629,922 | A | 5/1997 | Moodera et al. | 369/126 |
| 5,784,224 | A | 7/1998 | Rottmayer et al. | 360/113 |
| 6,330,136 | B1 | 12/2001 | Wang et al. | 360/324.2 |
| 7,248,448 | B2 * | 7/2007 | Fukuzawa et al. | 360/324.12 |
| 2002/0181170 | A1 | 12/2002 | Lin et al. | 360/324.11 |
| 2003/0179515 | A1 | 9/2003 | Pinarbasi | 360/324.11 |
| 2003/0227721 | A1 | 12/2003 | Gill | 360/314 |
| 2004/0087037 | A1 | 5/2004 | Berg et al. | 438/3 |
| 2004/0121185 | A1 | 6/2004 | Fukuzawa et al. | 428/692 |
| 2004/0170867 | A1 | 9/2004 | Chang et al. | 428/692 |
| 2004/0223266 | A1 | 11/2004 | Li | 360/324.1 |
| 2004/0246776 | A1 | 12/2004 | Covington | 365/173 |
| 2005/0063100 | A1 | 3/2005 | Kautzky et al. | 360/313 |
| 2005/0122635 | A1 | 6/2005 | Freitag et al. | 360/324.11 |
| 2005/0280957 | A1 | 12/2005 | Gill | 360/324.12 |
| 2005/0282068 | A1 | 12/2005 | Liu et al. | 429/128 |
| 2006/0002032 | A1 | 1/2006 | Li et al. | 360/315 |
| 2006/0092581 | A1 | 5/2006 | Zheng et al. | 360/324.12 |
| 2007/0035890 | A1 | 2/2007 | Sbiaa | 360/324.11 |
| 2008/0029147 | A1 | 2/2008 | Yang et al. | 136/244 |
| 2008/0107885 | A1 | 5/2008 | Alpay et al. | 428/220 |

* cited by examiner

*Primary Examiner* — David Lam
(74) *Attorney, Agent, or Firm* — Zilka-Kotab, PC (57) ABSTRACT

A magnetoresistive sensor having a scissor free layer design and no pinned layer. The sensor includes first and second free layers that have magnetizations that are oriented at 90 degrees to one another and has a third magnetic layer with a magnetization that is antiparallel coupled with one of the free layers. The antiparallel coupling of the third magnetic layer with one of the free layers, allows the sensor to be used in a tunnel valve design, having an electrically insulating barrier layer between the free layers. The tunnel valve design reduces spin torque noise in the sensor, and the presence of the third magnetic layer allows the free layers to remain bias at 90 degrees to one another in spite of interfacial coupling through the very thin barrier layer.

22 Claims, 8 Drawing Sheets

CPP DUAL FREE LAYER MAGNETORESISTIVE HEAD FOR MAGNETIC DATA STORAGE

FIELD OF THE INVENTION

The present invention relates to magnetoresistive sensors and more particularly to sensor employing a stable scissor free layer design with no pinned layer.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading, functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos θ, where θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

SUMMARY OF THE INVENTION

The present invention provides a magnetoresistive sensor that includes a first magnetic free layer having a first magnetization, a second magnetic free layer having a second magnetization and wherein the first and second magnetizations are biased to be at 90 degrees with respect to one another in the absence of an external magnetic field. The sensor also includes a non-magnetic, electrically insulating barrier layer sandwiched between the first and second free layer, a third magnetic layer having a third magnetization and an antiparallel coupling layer sandwiched between the third magnetic layer and the second free layer, the antiparallel coupling layer having a thickness to antiparallel couple the third magnetic layer and the second free layer such that the third magnetization is antiparallel with the second magnetization.

The tri-layer design of the sensor allows the sensor to be used in a tunnel valve sensor structure, which greatly reduces spin torque noise, even though the thin barrier layer used in the tunnel valve design produces interfacial coupling that aligns the magnetizations of the free layers in the same parallel direction.

By antiparallel coupling the one of the free layers with the third magnetic layer and making the third magnetic layer thicker than either of the free layers, the first and second free layers can be biased to be at 90 degrees to one another and can respond appropriately to an external magnetic field to produce a desired magnetoresistive signal.

These and other advantages and features of the present invention will be apparent upon reading the following detailed description in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
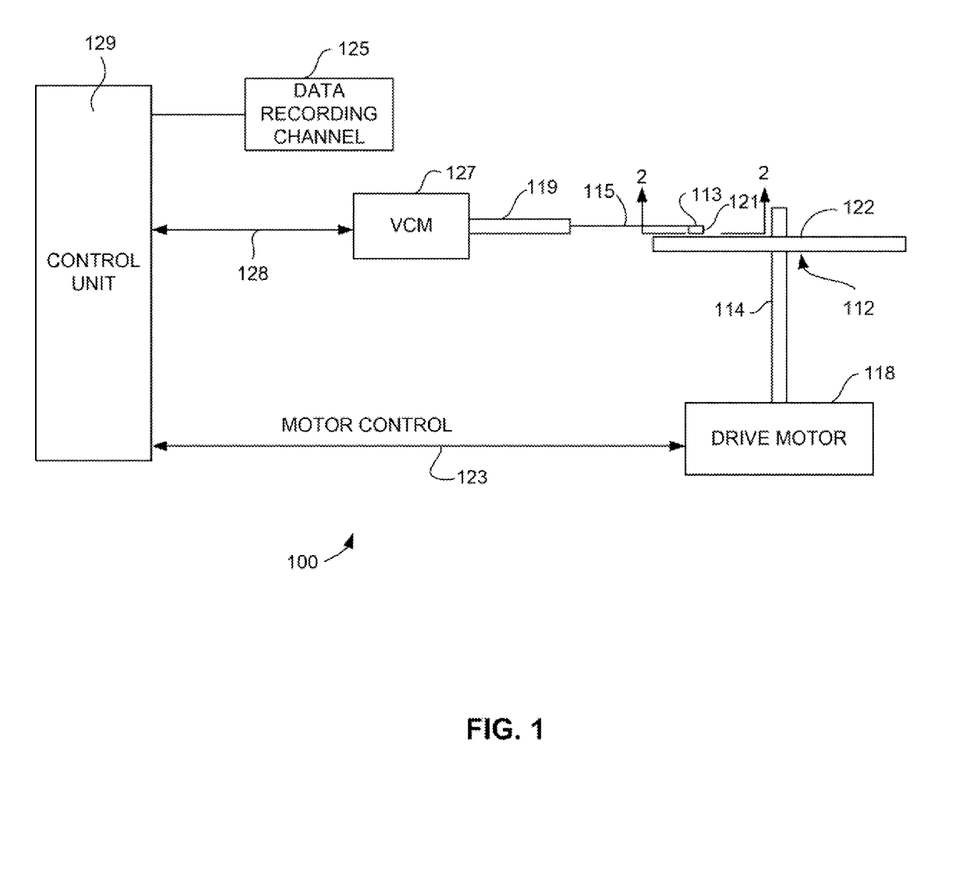
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil, movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
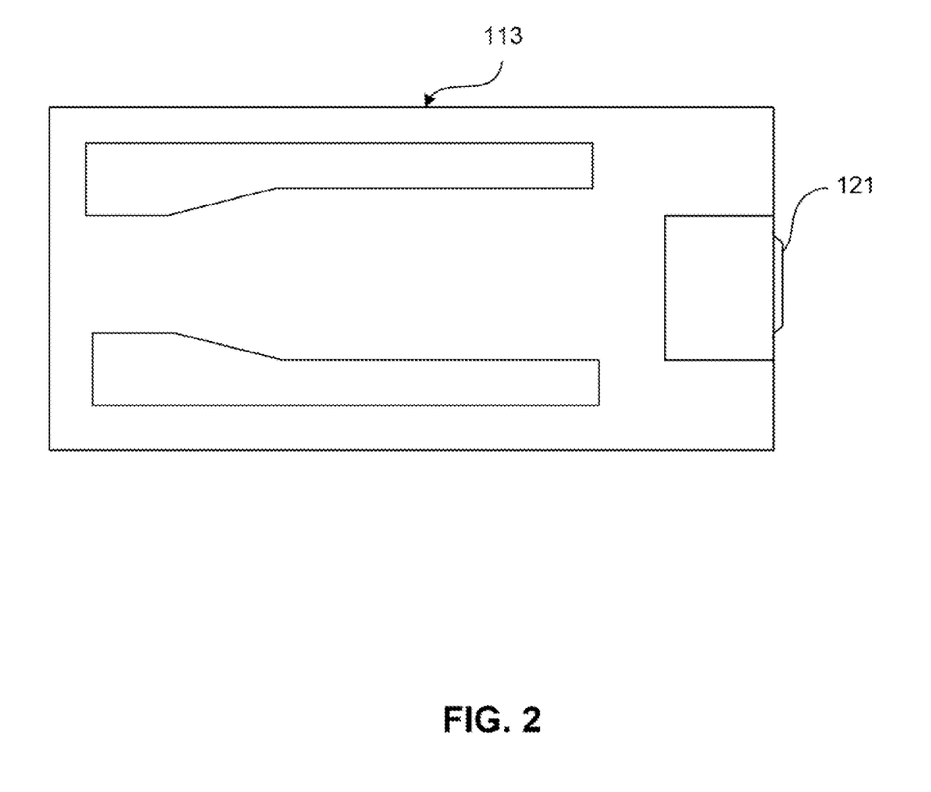
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
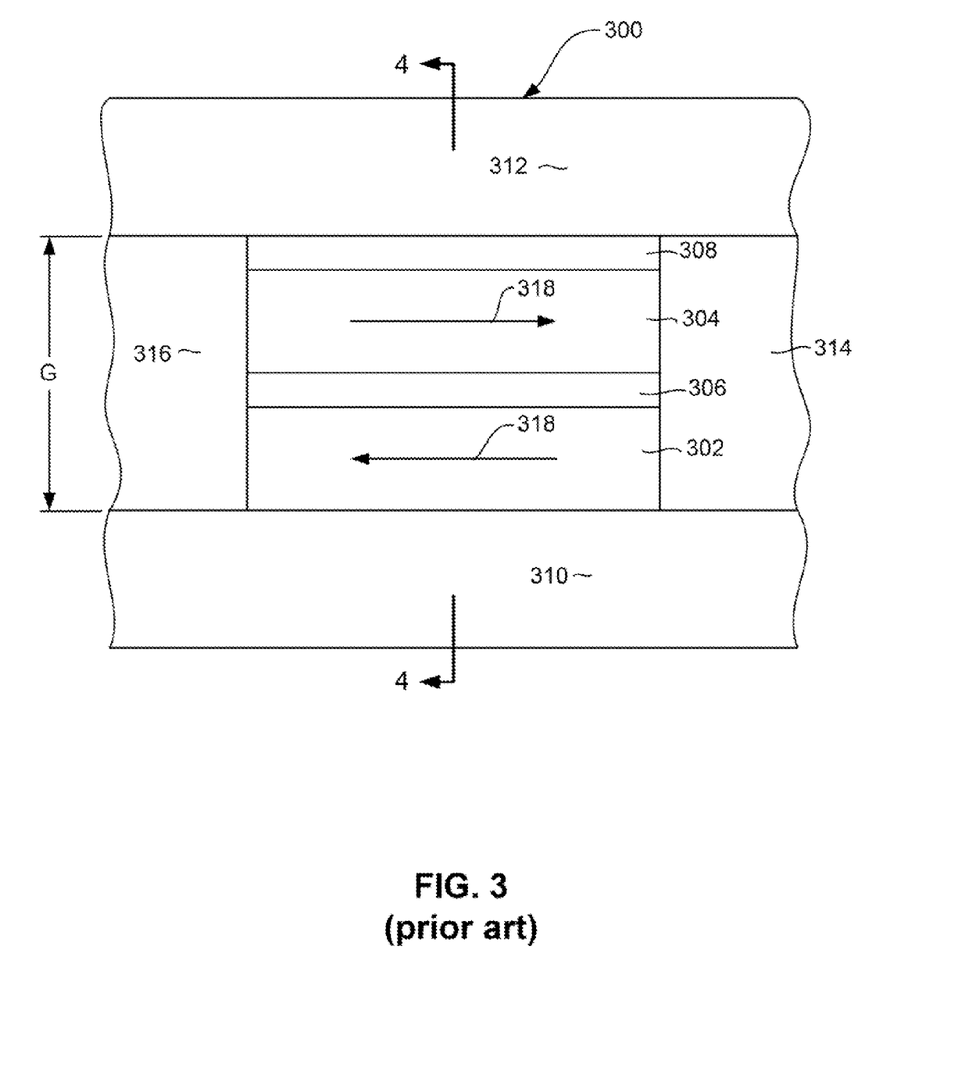
FIG. 3 is an air bearing surface view of a prior an magnetoresistive sensor.
Figure 4:
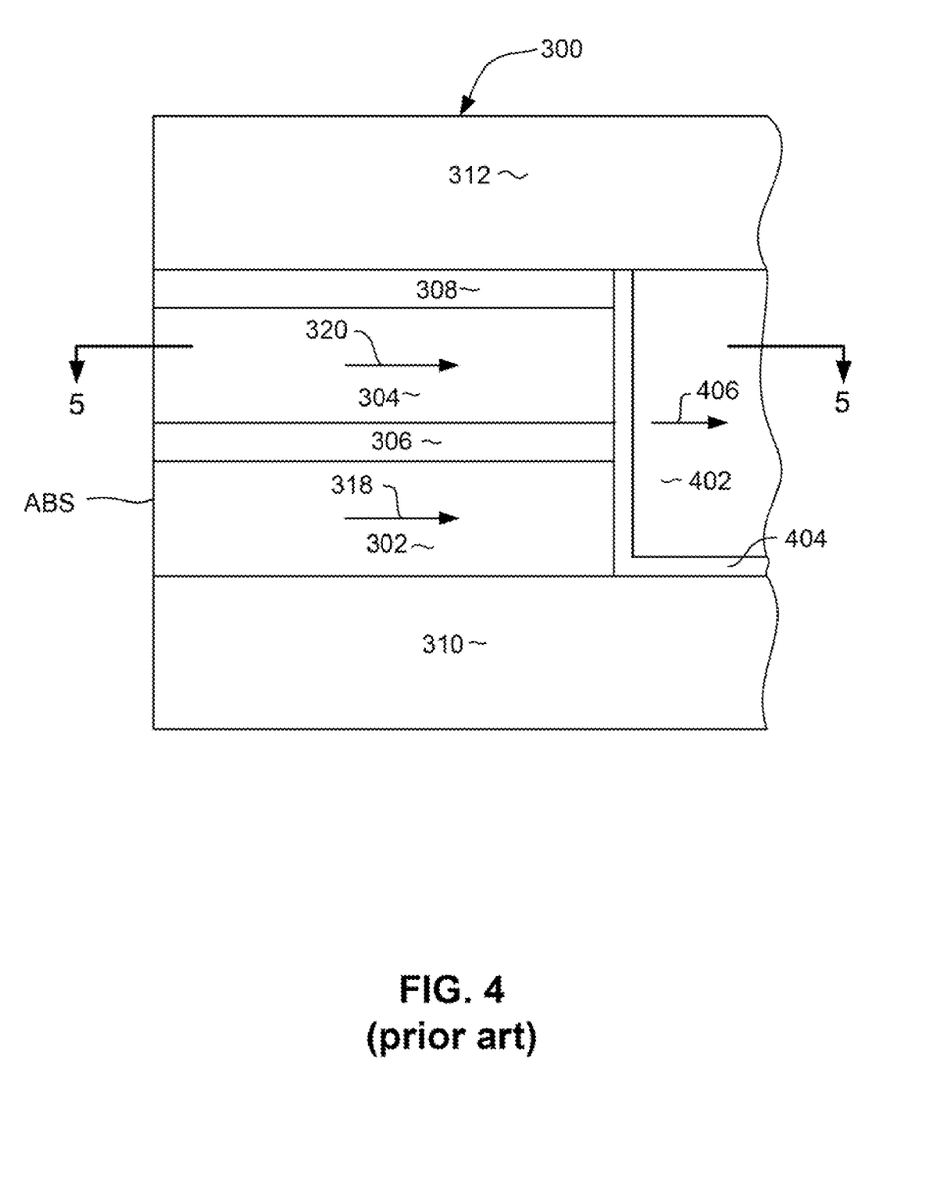
FIG. 4 is a side cross sectional view of the prior an magnetoresistive sensor of FIG. 3.
Figure 5:
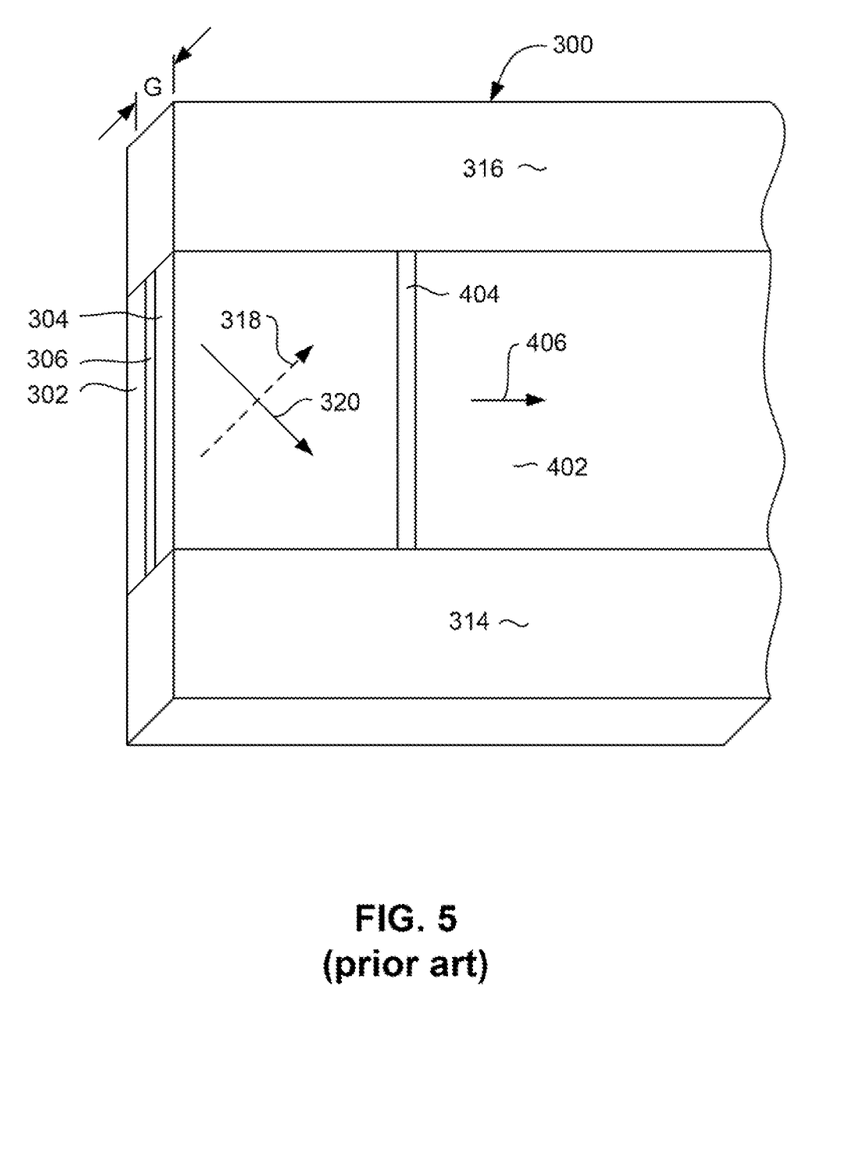
FIG. 5 is a top-down view of the prior art magnetoresistive sensor of FIGS. 3 and 4.

In order to increase data density in magnetic recording systems, researchers have sought to develop magnetoresistive sensors capable of extending sensor performance beyond that available to GMR sensors. FIGS. 3-5 illustrate a sensor that has been proposed, but which has not yet resulted in a valid, functioning sensor for use in a recording head. With reference to FIG. 3, such a sensor 300 includes first and second magnetic free layers 302, 304, and a non-magnetic, electrically conductive spacer layer 306 sandwiched between the first and second magnetic free layers 302, 304. A capping layer 308 can be provided above the second free layer 304 to protect the layers 302, 304, 306 during manufacture. The layers 302-308 are sandwiched between first and second shield layers 310, 312, which can be constructed of an electrically conductive, magnetic material such as NiFe or CoFe so that they can function as electrically conductive leads as well as shields. Insulation layers 314, 316 can be provided at either side of the sensor layers 302, 304, 306, 308 as fill layers between the shields 310, 312. The insulation layers 314, 316 can be constructed of a material such as alumina.

The first and second free layers 302, 304 have magnetizations 318, 320 that are biased to be oriented 90 degrees relative to one another in the absence of an external magnetic field. As shown in FIG. 4, the sensor 300 has an air bearing surface (ABS). A hard magnetic bias layer 402, constructed of a magnetic material such as CoPtCr or some similar material is formed at the back of the sensor layers 302, 304, 306, 308 opposite the ABS. The hard magnetic layer 402 is separated from the sensor layers 302, 308 and from the first shield 310 by a thin insulation layer 404.

As can be seen with reference to FIGS. 3 and 4, the first and second free magnetic layers 302, 304 are antiparallel coupled with one another such that their magnetizations 318, 320 tend to align antiparallel with one another as seen in FIG. 4. In the absence a magnetic biasing field, the magnetizations 318, 320 would align in antiparallel directions oriented parallel with the ABS as a result of this antiparallel coupling and a shape enhanced magnetic anisotropy. However, as can be seen in FIG. 4, the bias layer 402 has is magnetized to have a magnetic bias field 496. This magnetic bias field pulls the orientation of the magnetizations 320, 318 away from being perfectly parallel with the ABS. The amount of bias field 406 is preferably fixed at such a strength that the magnetizations 318, 320 will be oriented at 90 degrees with respect to one another, which can be seen more clearly in FIG. 5. In FIG. 5, the magnetization 318 is shown in dashed line to indicate that it is within the layer 302 in a plane beneath the layers 304, 306.

With the magnetizations 318, 320 biased in 90 degrees with respect to one another, the magnetic response of the sensor is within a linear region of the transfer curve (similar to the pinned and free layers of a standard GMR sensor). When in the presence of a magnetic field, oriented perpendicular to the plane of the ABS, the magnetizations 318, 320 will move to be either more parallel to one another (away from the ABS in FIG. 5) or more antiparallel (toward the ABS in FIG. 5). As the magnetizations 318, 320 become more parallel to one another the electrical resistance through the layers 302, 304, 306 decreases. Conversely, as the magnetizations 318, 320 become closer to antiparallel to one another the resistance across these layers 302, 304, 306 increases. As can be imagined then, the motion of the magnetization 318, 320 in response to a magnetic field, resembles the blades of a scissor. For this reason, the free layer structure described above can be referred to as a "scissor" free layer structure.

As can be seen then, structure described above does not require a magnetic pinned layer such as would be necessary in a standard GMR structure. What's more, the scissor structure does not require a thick AFM layer that would be necessary to pin the magnetization of a pinned layer of a standard GMR sensor. Therefore, if a scissor structure such as the one described above could be constructed in a manner that would render a workable sensor, such a sensor would have, an advantageously small gap thickness G, which corresponds to a reduced magnetic hit length. Therefore such a structure has the potential to increase data density by decreasing bit length.

Unfortunately, however, the structure described above suffers from excessive spin torque noise. Spin torque noise results when the spin polarization of electrons flowing through one layer affect the magnetization of a subsequent layer through which they flow. For example, as electrons flow from lead 312, to lead 310, they flow first through the free layer 304, then through the spacer 306 and then through the second free layer 302. As the electrons travel through the upper free layer 304 the spin of the electrons tends to become polarized by with the magnetization 320. As these electrons flow through the bottom free layer 302, this polarization of electrons tends affects the magnetization 318 of the bottom free layer 302. This affect on the magnetization 318 is so great that the magnetization 318 is completely destabilized. Sufficient signal noise is introduced that the sensor is not practical for use in a data recording system. Furthermore, this stabilization affect goes both ways. As described above, the upper free layer 304 destabilizes the bottom free layer 302. However, the bottom free layer 302 has a similar affect, destabilizing the upper free layer 304.

One way to reduce this spin torque noise is to construct the sensor as a tunnel valve having an electrically resistive barrier layer rather than an electrically conductive spacer layer. A tunnel valve operates based on the spin dependent tunneling of electrons through a thin, electrically resistive barrier layer. As such a tunnel valve has a higher resistance than a GMR sensor and, therefore, has reduced current flow through the sensor. This results in reduced spin torque noise. However, interfacial coupling between through the very thin barrier layer causes the magnetizations of the free layers to be oriented, parallel to one another, making it virtually impossible to maintain the 90 orientation of the scissor structure described above.

Figure 6:
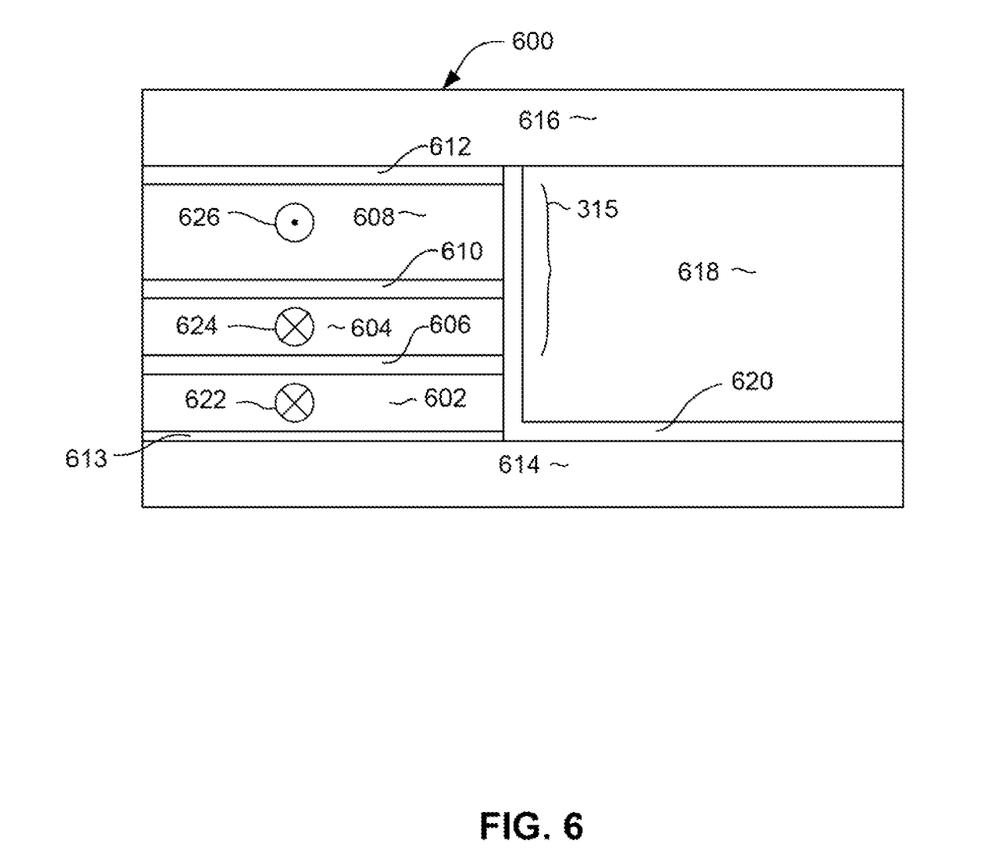
FIG. 6 is a side cross sectional view of a magnetoresistive sensor according to an embodiment of the invention, shown without magnetic biasing.
Figure 7:
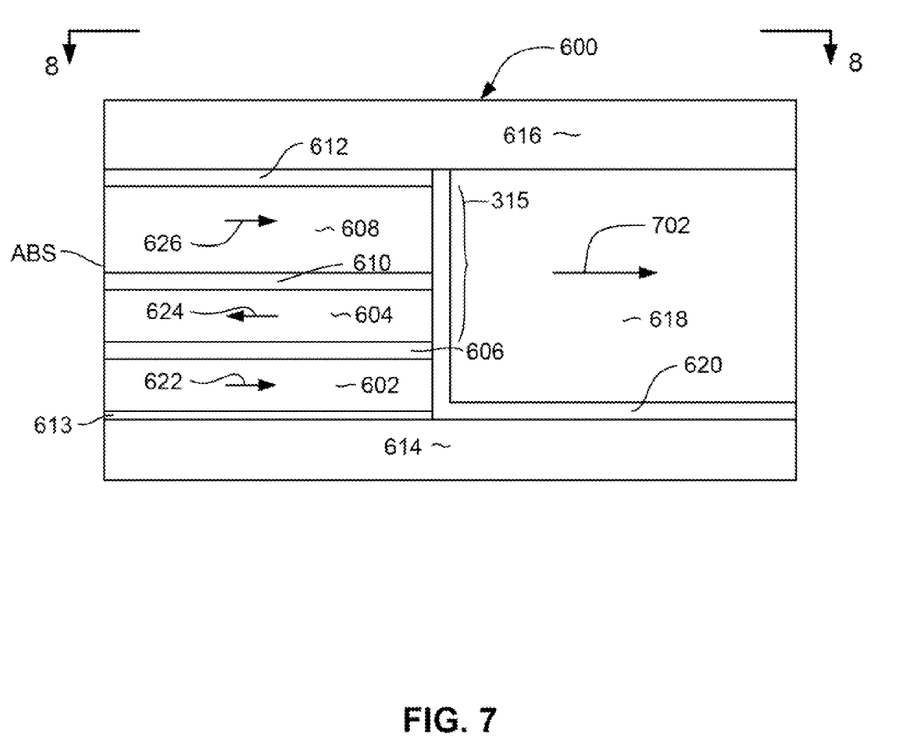
FIG. 7 is a side cross sectional view of a magnetoresistive sensor according to an embodiment of the invention, shown with magnetic biasing.
Figure 8:
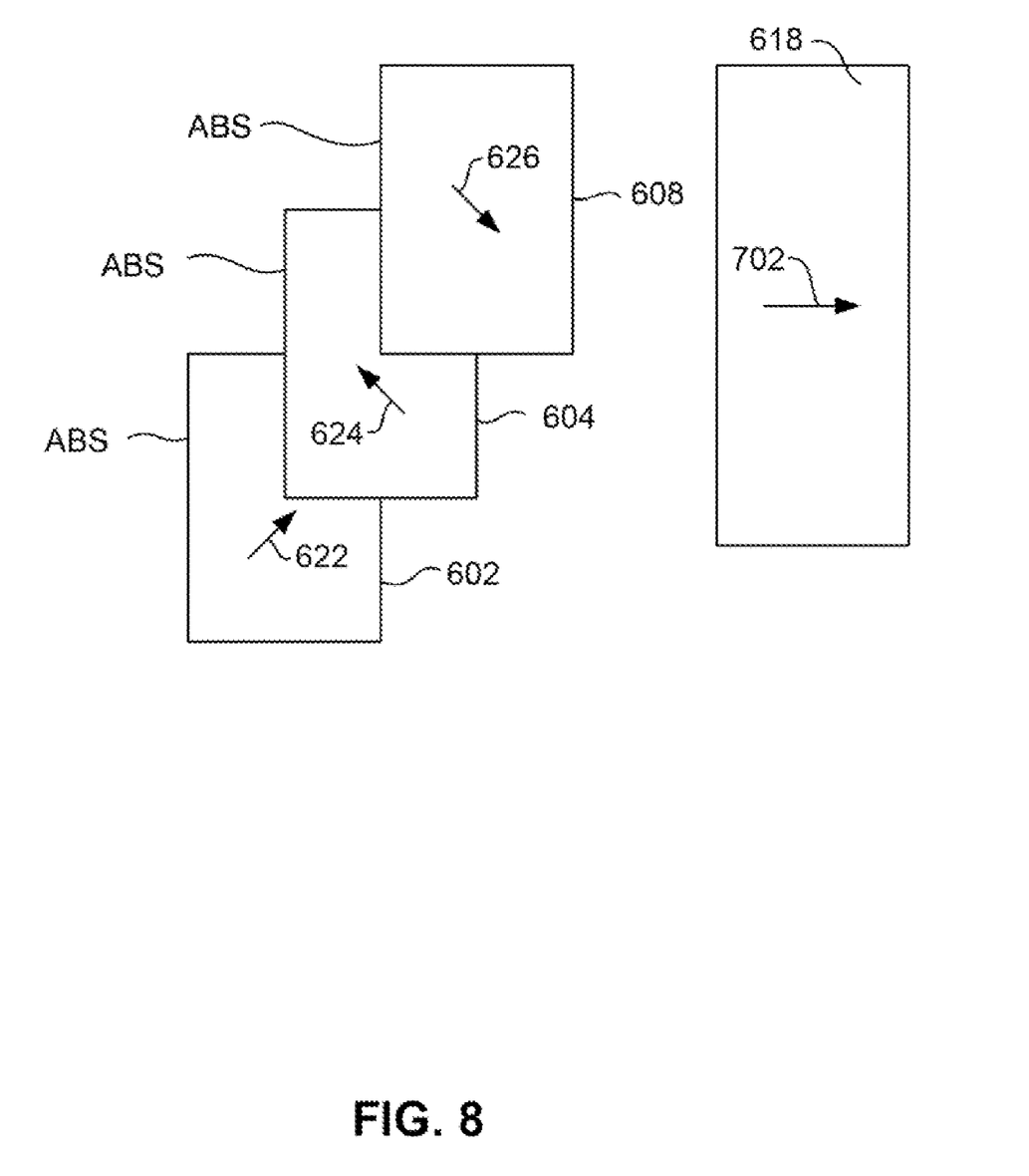
FIG. 8 is an exploded, top-down vim of layers of a magnetoresistive sensor according to an embodiment of the invention.

With reference to FIGS. 6-8, the present invention provides a structure that allows a free layer scissor structure to be employed (allowing the advantage of reduced gap thickness and increased data density) while avoiding the spin torque noise problems associated with prior art scissor structure designs. The present invention also provides increased DR/R performance, increasing sensor sensitivity.

FIGS. 6 and 7 shows side cross sectional views of a sensor 602 according to an embodiment of the invention. For purposes of illustration, FIG. 6 shows a sensor 600 without any magnetic biasing, whereas FIG. 7 shows the sensor 600 with a magnetic bias field 702. The sensor 600 includes first and second magnetic free layers 602, 604, with a thin, non-magnetic barrier layer 606 sandwiched between the free layers 602, 604. The first and second magnetic free layers 602, 604 can be constructed of a material such as CoFe, NiFe, CoFeB, Heusler alloys (such as $Co_2FeGe$, $Co_2MnGe$, $Co_2MnSi$, etc.) or some combination of these materials. The barrier layer can be a material such as MgO, $Al2O_3$ or TiOx. It should be pointed out that, while the present invention, is being described as a tunnel valve structure, it could also be embodied in a GMR structure in which case the layer 606 could be an electrically conductive layer such as Cu.

With continued reference to FIGS. 6 and 7, the sensor 600 includes a third magnetic layer 608 that is separated from the second magnetic free layer by an antiparallel coupling layer 610. The third magnetic layer 608 can be constructed of the same material as the first and second free layers 602, 604, or could be constructed of another magnetic material. The antiparallel coupling layer 610 can be constructed of a material such as Ru, and is constructed to such a thickness as to antiparallel couple the third magnetic layer 608 and the second free layer 604. A capping layer 612 can be provided above the layers 602-610 to protect the layer during manufacture. In addition, a seed layer such as 613 as Ta, Ru, Cu, NiFeCr or a combination of these materials may be provided beneath the first free layer 602 to promote a desired crystalline grain growth in the above layers 604-610.

The layers 602-612 are sandwiched between first and second magnetic shields 614, 616. A hard magnetic bias layer 618 is provided at the back of the sensor layers 602-612 opposite the air bearing surface ABS. The hard magnetic bias layer 618 is separated from the sensor layers 602-612 and from the shield 614 by a thin insulation layer 620 to prevent sense current from being shunted through the hard bias layer 618.

FIG. 6 shows the sensor 600 without any biasing. In other words, simply for purposes of illustration, the layer 618 is not magnetized and provides no magnetic field. In the absence of a magnetic field, the first and second magnetic free layers 602, 604 are coupled by interfacial coupling through the very thin barrier layer 606. This interfacial coupling, along with shape induced magnetic anisotropy causes the first and second free layers 602, 604 to have magnetizations 622, 624 that are aligned in the same direction (parallel with one another) in a direction parallel with the ABS in the absence of a magnetic field (either external or from the bias layer 618).

The third magnetic layer 608 has a magnetization 626 that is oriented in a direction opposite (anti-parallel) to the magnetizations 622, 624 of the first and second free layers 602, 604. This is due to the antiparallel coupling of the layer 608 with the second magnetic layer 604 across the antiparallel coupling layer 610. The magnetization 626 of the third magnetic layer 608 is not pinned, but is free to move in response to a magnetic field. Therefore, the third magnetic layer 608 could be considered to be a third free layer. However, the third magnetic layer 608 does not contribute to the magnetoresistive effect, because it is not separated from the adjacent free layer 604 by a barrier layer such as the barrier layer 606 or as spacer in the case of a GMR sensor). The third magnetic layer is actually part of an AP coupled synthetic second free layer structure 615.

The third magnetic layer 608 has a thickness that is greater than that of each of the first and second magnetic free layers 602, 604. In fact the layer 608 preferably has a thickness that is about equal to the combined thicknesses of the first and second free layers. More accurately, the layer 608 has a magnetic thickness that is about equal to sum of the magnetic thicknesses of the first and second magnetic layers. The magnetic thickness can be defined as the physical thickness of a layer multiplied by the magnetic moment of the layer. Therefore, if the layers 602, 604, 608 are constructed of the same material, then the physical thickness of the layer 608 would be about equal to the sum of the physical thicknesses of the layers 602, 604. If the layer 608 is constructed of as different material than the layers 602, 604, then the layer 608 will have a physical thickness such that the magnetic thickness of the layer 608 is about equal to the sum of the magnetic thicknesses of the layers 602, 604.

With reference now to FIG. 7, the hard magnetic bias layer 702 is magnetized so that it produces a magnetic bias field 702 oriented perpendicular to the ABS. This bias field pulls the magnetization 626 of the third magnetic layer 608 away from being parallel with the ABS. Because the layer 608 is antiparallel coupled with the layer 604, the magnetization 624 of the second free layer 624 moves in an opposite direction as indicated by the arrow 624 in FIG. 7. Because the layer 608 is magnetically thicker than layer 604, there is a net magnetic difference between the two layers. This allows the magnetization 626 of the thicker layer 608 to follow the bias field 702 while the magnetization 624 of the second magnetic layer moves in an antiparallel fashion relative to the magnetization 626.

The resulting orientation of the magnetizations 622, 624, 626 can be seen more clearly with reference to FIG. 8, which shows an exploded view of the first and second free layers 602, 604 and third magnetic layer 608. As can be seen, the magnetizations 622, 624 of the first and second free layers 602, 604 are oriented at 90 degrees relative to one another and also are oriented at 45 degrees relative to the air bearing surface (ABS). Also, the magnetization 626 of the third magnetic layer 608 is oriented at 180 degrees relative to the magnetization 624 of the second magnetic layer 604. In other words, the magnetizations 626 and 624 are antiparallel with one another, even after being biased by the bias field 702. The magnetization 626 of the third magnetic layer 608 is also oriented at 90 degrees relative to the magnetization 622 of the first magnetic layer 602.

As mentioned above, the first and second free layers 602, 604 are exchange coupled, such that interfacial coupling between the layers 602, 604 causes the magnetizations 622, 624 to tend to align in the same direction. On the other hand, the layers 604 and 608 are antiparallel coupled, and layer 608 is significantly thicker than layer 604. Therefore, between layers 608 and 604, there is a net magnetic moment that allows the magnetization 626 to follow the bias field 702. The antiparallel coupling between the layers 604 and 608 causes the magnetization 624 to remain antiparallel with the magnetization 626 even in the presence of the magnetic bias field 702. However the magnetization 622 of the first magnetic layer 602 is not antiparallel coupled with the third magnetic layer 608, and therefore, the magnetization 622 is free to follow the bias field, allowing, the layers 622 and 624 to be oriented at 90 degrees relative to one another in the absence of a magnetic field.

All of the magnetic layers 602, 604, 608 are un-pinned. That is, none of the magnetic layers 602, 604, 608 are exchange coupled with a layer of anti ferromagnetic material (ATM), and all of the magnetic layers 602, 604, 608 have magnetizations 622, 624, 626 that are free to move or rotate in response to a magnetic field. In the presence of a magnetic field, such as from a magnetic medium, the magnetization 626 will respond in the same manner as the magnetization 622. However, since the second free layer 604 is antiparallel coupled with the layer 608 this causes the magnetization 624 to respond in an opposite direction as compared with the magnetizations 622 and 626. This allows the magnetizations to 622, 624 to behave in a "scissor" fashion even though they are interfacially coupled to be oriented in the same direction. For example, if an external magnetic field oriented to the right causes the magnetization 622 of the first magnetic layer to move to the right (i.e. closer to perpendicular to the ABS), then the magnetization 626 will do so as well. The magnetization 624 of the second magnetic layer will, however, move in an opposite direction due to its antiparallel coupling with layer 608. This causes the magnetizations 624, 622 to be more antiparallel with one another which increases resistance across through the sensor.

The present invention, advantageously allows a scissor free layer structure to be used with a tunnel valve design having an electrically insulating barrier layer rather than an electrically conductive spacer layer. The increased electrical resistance of the tunnel valve design decreases the current flow through the sensor as compared with a GMR design. This greatly reduces the effects of spin torque noise on the sensor, making the scissor design feasible and functional. It should be pointed out, however, that this tri-layer design could also be used within a GMR sensor design having an electrically conductive spacer layer rather than a barrier layer 606.

The scissor design advantageously eliminates the need for a magnetic pinned layer, such as would be used in a standard GMR or TMR sensor design. This greatly reduces the gap thickness (and bit length) by eliminating the pinned layer and (more importantly) eliminating the need for a thick antiferromagnetic pinning layer.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
   a first magnetic layer;
   a second magnetic layer
   a thin, non-magnetic, electrically insulating barrier layer sandwiched between the first and second magnetic layers, the thin, non-magnetic, electrically insulating barrier layer being sufficiently thin to produce an interfacial coupling, between the first and second magnetic layers;
   a third magnetic layer; and
   an antiparallel coupling layer sandwiched between the second and third magnetic layers, and wherein
   all magnetic layers are magnetically unpinned.

2. A magnetoresistive sensor as in claim 1 wherein the third magnetic layer has a thickness that is greater than a thickness of the second magnetic layer.

3. A magnetoresistive sensor as in claim 1 wherein the third magnetic layer has a thickness that is substantially equal to a combined thickness of the first and second magnetic layers.

4. A magnetoresistive sensor as in claim 1 wherein the antiparallel coupling layer comprises Ru.

5. A magnetoresistive sensor as in claim 1 wherein the antiparallel coupling layer comprises Ru and is of such a thickness as to antiparallel couple the second and third magnetic layers.

6. A magnetoresistive sensor as in claim 1 wherein each of the first, second and third magnetic layers has an edge that is disposed toward an air bearing surface and a back edge disposed away from the air bearing surface, and further comprising a hard magnetic bias layer disposed adjacent to the back edge of the first, second and third magnetic layers.

7. A magnetoresistive sensor as in claim 6 further comprising a non-magnetic, electrically insulating layer disposed between the hard magnetic bias layer and the back edge of the first, second and third magnetic layers.

8. A magnetoresistive sensor as in claim 6 wherein the hard magnetic bias layer produces a magnetic bias field that is oriented perpendicular the air bearing surface.

9. A magnetoresistive sensor as in claim 1 wherein the third magnetic layer has a magnetic thickness that is substantially equal to as combined magnetic thickness of the first and second magnetic layers, magnetic thickness being defined as a physical thickness of a layer multiplied by a magnetic moment of the layer.

10. A magnetoresistive sensor as in claim 1 wherein the non-magnetic, electrically insulating barrier layer comprises MgO.

11. A magnetoresistive sensor as in claim 1 wherein the non-magnetic, electrically insulating layer comprises MgO and the antiparallel coupling layer comprises Ru.

12. A magnetoresistive sensor as in claim 6 further comprising a layer of alumina separating the magnetically hard bias layer from the back edges of the first, second and third magnetic layers.

13. A magnetoresistive sensor as in claim 6 wherein the hard magnetic bias layer comprises CoPt.

14. A magnetoresistive sensor as in claim 6 wherein the hard magnetic bias layer produces a magnetic bias field oriented perpendicular to the air bearing surface, and wherein the antiparallel coupling layer anti parallel couples the second and third magnetic layers, and wherein the interfacial coupling between the first and second magnetic layers combined with the antiparallel coupling between the second and third magnetic layers and the bias field from the hard magnetic bias layer, bias the first and second magnetic layers to have magnetizations that are perpendicular to one another and 45 degrees with respect to the air bearing surface.

15. A magnetoresistive sensor as in claim 14 wherein the interfacial coupling, antiparallel coupling and magnetic bias field also cause the third magnetic layer to have a magnetization that is perpendicular to the magnetization of the first magnetic layer, anti-parallel with the magnetization of the second magnetic layer and 45 degrees with respect to the air bearing surface.

16. A magnetoresistive sensor, comprising:
a first magnetic layer;
a second magnetic layer
an electrically conductive, non-magnetic spacer layer sandwiched between the first and second magnetic layers;
a third magnetic layer; and
an antiparallel coupling layer sandwiched between the second and third magnetic layers, and wherein
all magnetic layers are magnetically unpinned.

17. A magnetoresistive sensor as in claim 16 wherein the third magnetic layer has a thickness that is greater than a thickness of the second magnetic layer.

18. A magnetoresistive sensor as in claim 1 wherein the third magnetic layer has a thickness that is substantially equal to a combined thickness of the first and second magnetic layers.

19. A magnetoresistive sensor as in claim 16 wherein the third magnetic layer has a magnetic thickness that is substantially equal to a combined magnetic thickness of the first and second magnetic layers, magnetic thickness being defined as a physical thickness of a layer multiplied by a magnetic moment of the layer.

20. A magnetoresistive sensor as in claim 16 wherein each of the first, second and third magnetic layers has an edge that is disposed toward an air bearing surface and a back edge disposed away from the air bearing surface, and further comprising a hard magnetic bias layer disposed adjacent to the back edge of the first, second and third magnetic layers.

21. A magnetoresistive sensor as in claim 20 further comprising a non-magnetic, electrically insulating layer disposed between the hard magnetic bias layer and the back edge of the first, second and third magnetic layers.

22. A magnetoresistive sensor as in claim 20 wherein the hard magnetic bias layer produces a magnetic bias field that is oriented perpendicular the air bearing surface.

* * * * *

UNITED STATES PATENT AND TRADEMARK OFFICE
CERTIFICATE OF CORRECTION

PATENT NO. : 8,018,691 B2  
APPLICATION NO. : 12/254662  
DATED : September 13, 2011  
INVENTOR(S) : Gill et al.

Page 1 of 1

It is certified that error appears in the above-identified patent and that said Letters Patent is hereby corrected as shown below:

In the claims:

Column 8, Claim 9, line 52, please replace "equal to as combined" with --equal to a combined--

Signed and Sealed this  
Thirtieth Day of April, 2013

Teresa Stanek Rea  
*Acting Director of the United States Patent and Trademark Office*